United States Patent
Wang et al.

(10) Patent No.: US 12,133,355 B2
(45) Date of Patent: Oct. 29, 2024

(54) MOUNTING STRUCTURE FOR PREVENTING INCORRECT MOUNTING AND INSTALLATION OF COOLING FAN, ELECTRONIC DEVICE, AND SERVER

(71) Applicant: Fulian Precision Electronics (Tianjin) Co., LTD., Tianjin (CN)

(72) Inventors: Pao-Ching Wang, New Taipei (TW); Wen-Chen Wang, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 223 days.

(21) Appl. No.: 17/974,672

(22) Filed: Oct. 27, 2022

(65) Prior Publication Data

US 2023/0141410 A1    May 11, 2023

(30) Foreign Application Priority Data

Nov. 8, 2021    (CN) .......................... 202111314467.X

(51) Int. Cl.
  *H05K 7/20*    (2006.01)
  *H05K 7/14*    (2006.01)
(52) U.S. Cl.
  CPC ....... *H05K 7/20172* (2013.01); *H05K 7/1488* (2013.01); *H05K 7/20754* (2013.01)

(58) Field of Classification Search
  CPC ............. H05K 7/20172; H05K 7/1488; H05K 7/20754; H05K 7/20136
  See application file for complete search history.

(56) References Cited

U.S. PATENT DOCUMENTS

| | | | | |
|---|---|---|---|---|
| 2009/0021911 | A1* | 1/2009 | Lee ........................ | F04D 25/166 361/695 |
| 2012/0168001 | A1* | 7/2012 | Zhang ..................... | G06F 1/183 137/343 |
| 2013/0028709 | A1* | 1/2013 | Chen ..................... | F04D 19/007 415/119 |
| 2013/0045109 | A1* | 2/2013 | Lee ........................ | F04D 19/007 416/244 R |

* cited by examiner

*Primary Examiner* — Jacob R Crum
(74) *Attorney, Agent, or Firm* — ScienBiziP, P.C.

(57) ABSTRACT

A structure for mounting a cooling fan easily and conveniently and in the correct orientation only includes a chassis and at least one fan module. The chassis has a block, a first nut, and a second nut. The fan module has at least one accessory. The block is mounted on the first nut or the second nut. When the block is fixed on the first nut, the fan module can only be placed and installed so as to blow air into the chassis, and when the block is fixed on the second nut, the fan module can only be installed so as to extract air out of the chassis, thereby ensuring the correct mode of operation. An electronic device and a server using the structure is also disclosed.

20 Claims, 12 Drawing Sheets

MOUNTING STRUCTURE FOR PREVENTING INCORRECT MOUNTING AND INSTALLATION OF COOLING FAN, ELECTRONIC DEVICE, AND SERVER

FIELD

The subject matter herein generally relates to fan installing, and to a mounting structure for installing fan, an electronic device, and a server.

BACKGROUND

In an electronic device, a fan among many fans, may be installed incorrectly, and the fan cannot execute functions properly.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
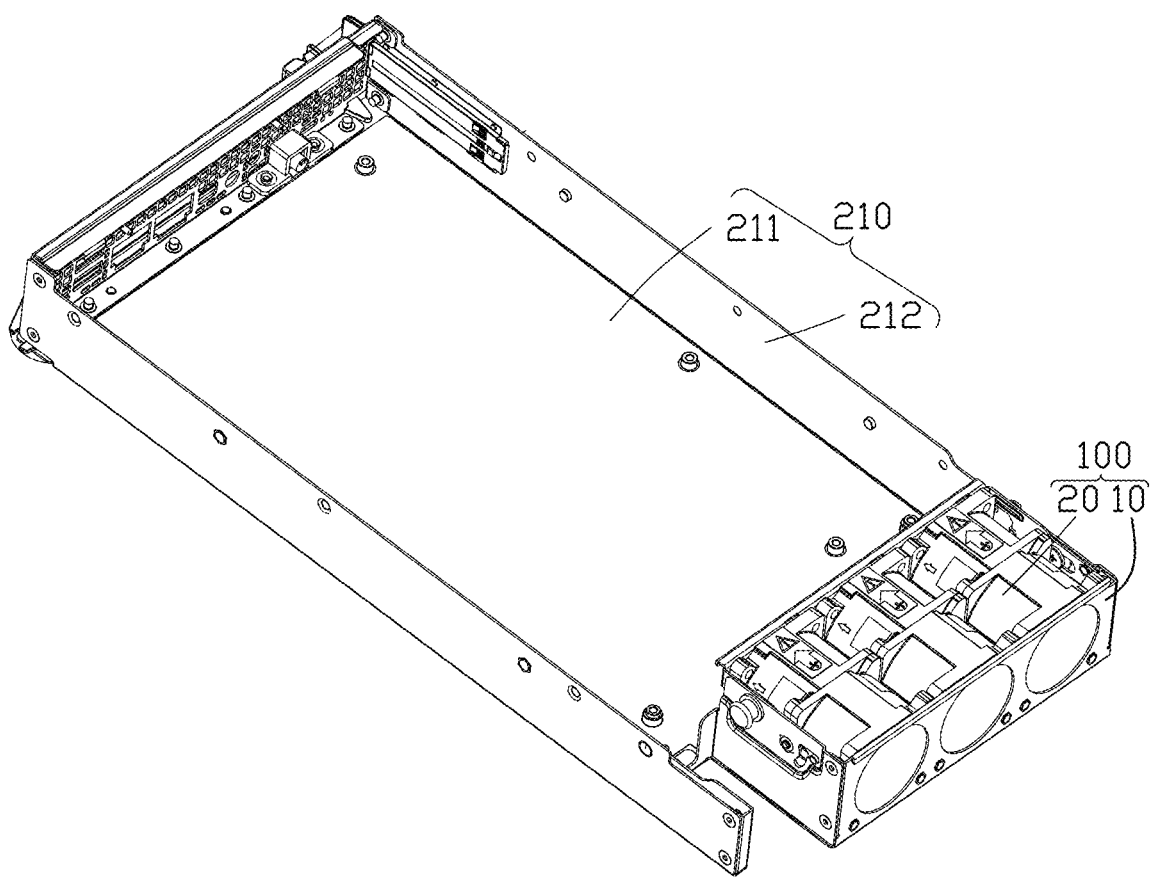
FIG. 1 is an isometric view of a mounting structure for one or more fans according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

Figure 2:
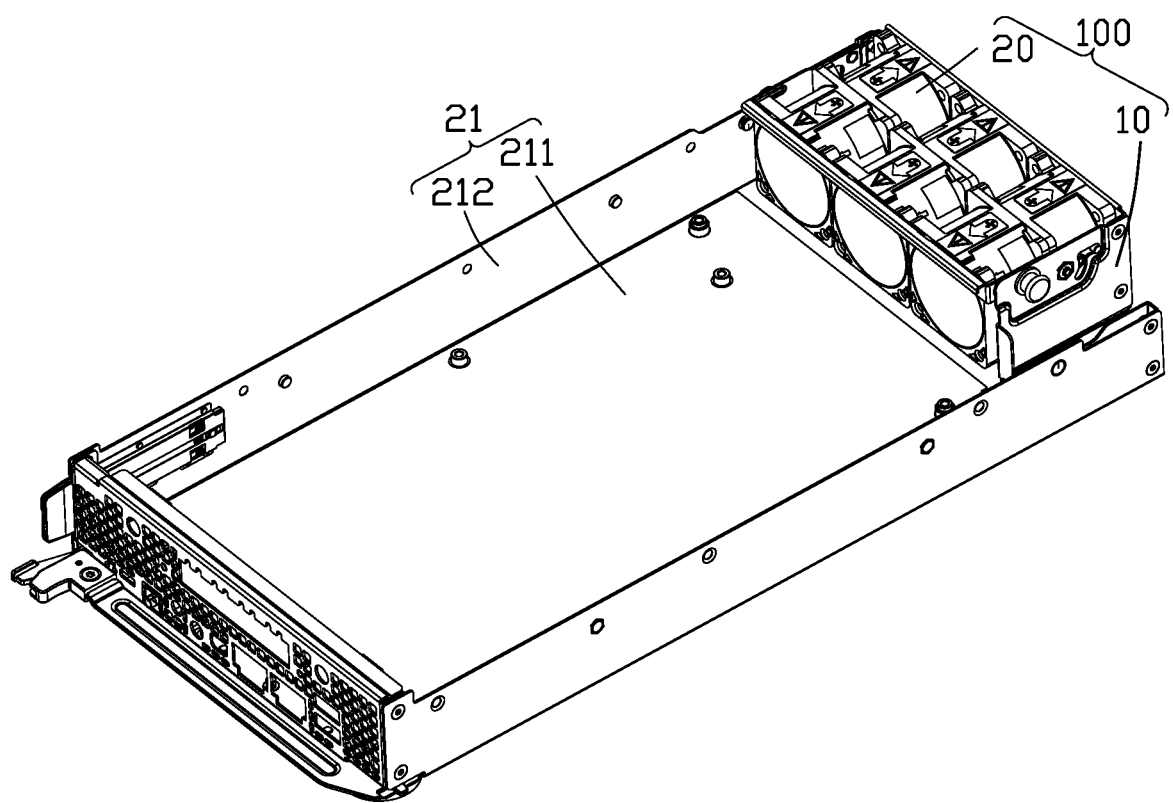
FIG. 2 is an isometric view of the mounting structure according to an embodiment of the present disclosure.
Figure 5:
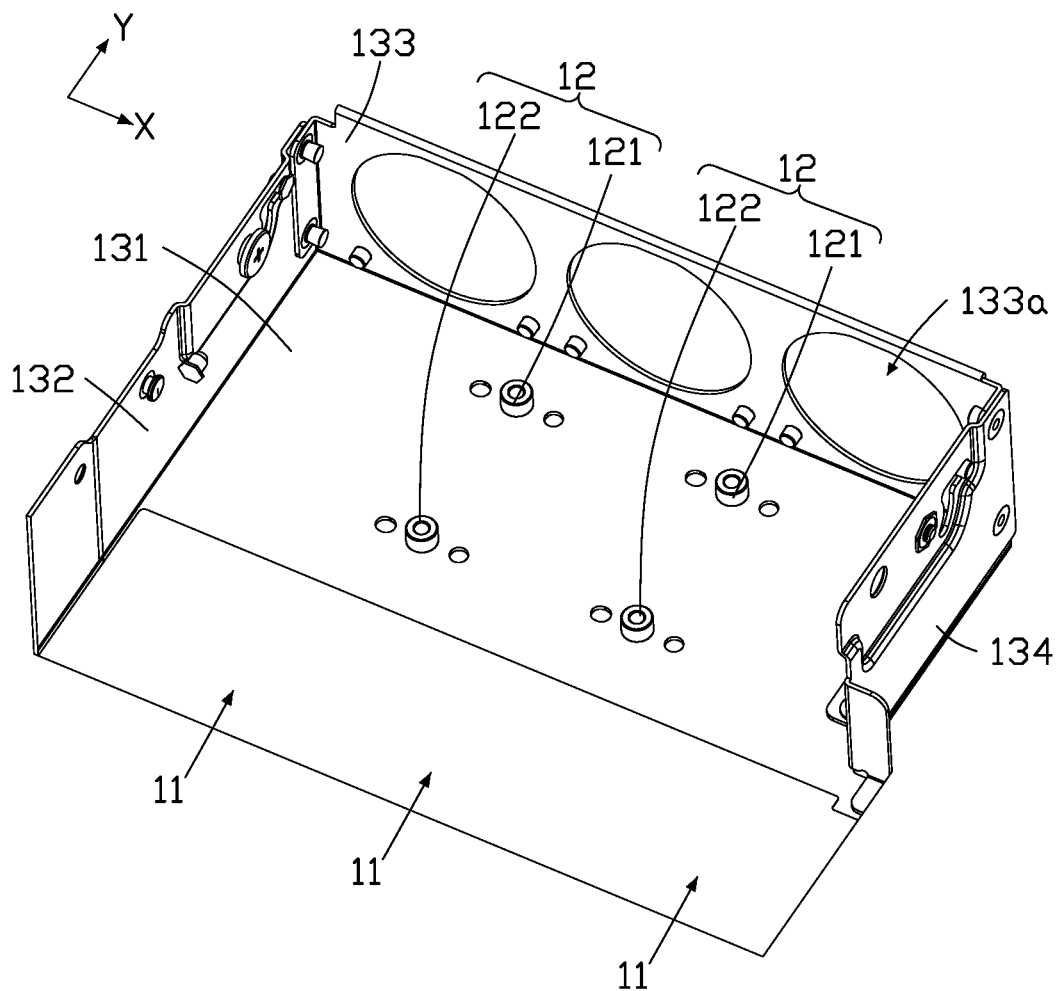
FIG. 5 is an isometric view of a chassis of the mounting structure according to an embodiment of the present disclosure.

As shown in FIG. 1 and FIG. 2, an electronic device 200 of an embodiment includes a mounting structure 100 and a bracket 210. The mounting structure 100 includes a chassis 10 and a fan module 20. The bracket 210 includes a bottom wall 211 and two side walls 212. Two side walls 212 are connected to the bottom wall 211. The chassis 10 includes a bottom plate 131, as shown in FIG. 5. The bottom plate 131 is connected to the bottom wall 211.

The chassis 10 allows installation of the fan modules 20. The fan module 20 is used to cool heat dissipating elements received in the bracket 210. The bottom wall 211 is used to support the heat dissipating elements. The heat dissipating elements may be, for example, processor, storage, etc.

Figure 3:
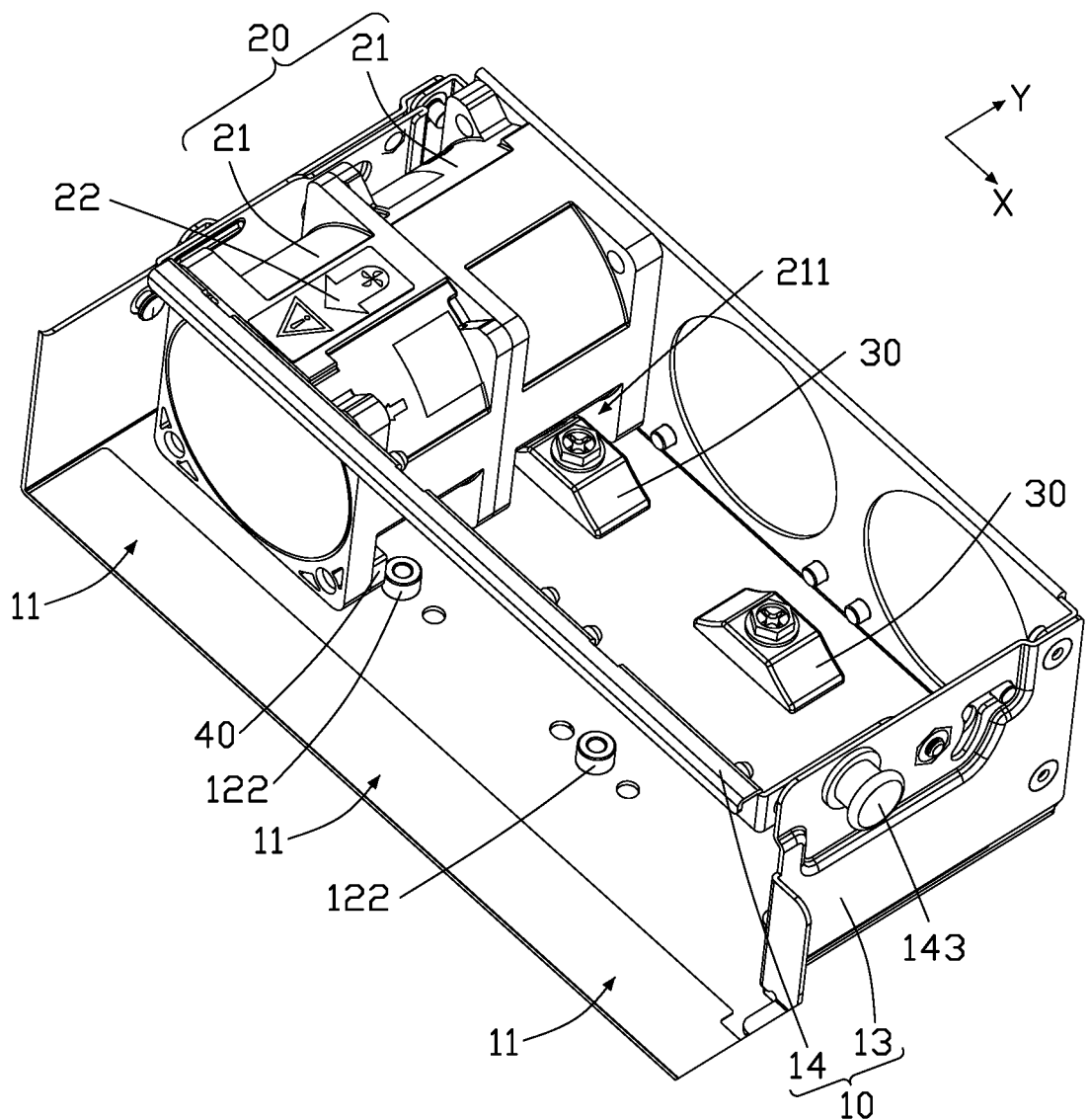
FIG. 3 is an isometric view of the mounting structure when a block is mounted on a first nut of the mounting structure according to an embodiment of the present disclosure.
Figure 4:
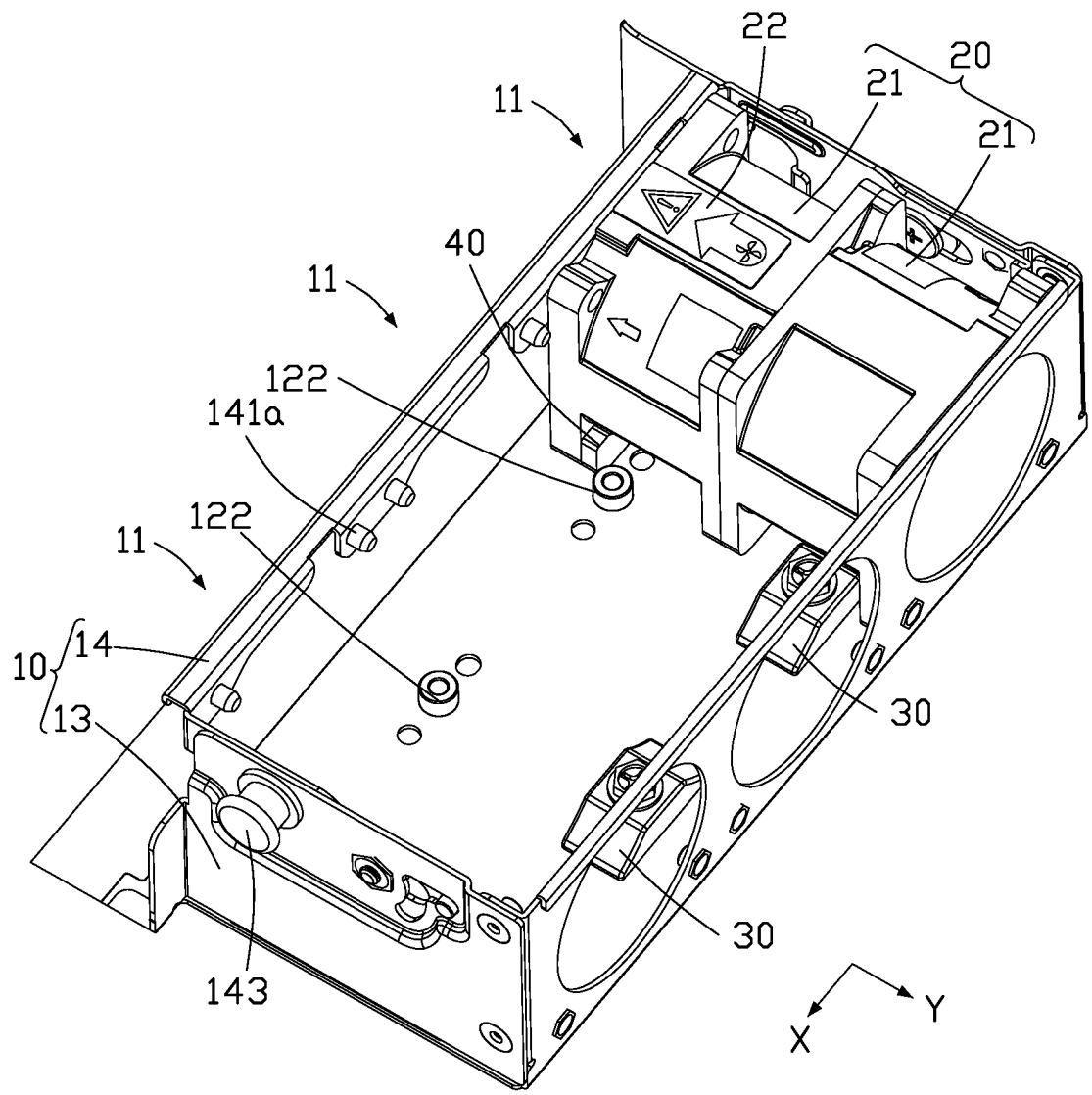
FIG. 4 is an isometric view of the mounting structure with the block mounted on the first nut according to an embodiment of the present disclosure.

As shown in FIG. 3 and FIG. 4, the mounting device 100 further includes a block 30 and an accessory 40. The block 30 is mounted on the bottom plate 131. The accessory 40 is mounted on the fan module 20.

The chassis 10 defines a plurality of installing positions 11 along a direction X. One fan module 20 is placed in each installing position 11. Each fan module 20 includes a fan 21. For example, the fan module 20 includes two fans 21, and the two fans 21 are arranged along a direction Y. Air flows along the direction Y in the fan 21. The direction Y is substantially perpendicular to the direction X. As shown in FIG. 3 and FIG. 4, three installing positions 11 are defined along the direction X.

Figure 6:
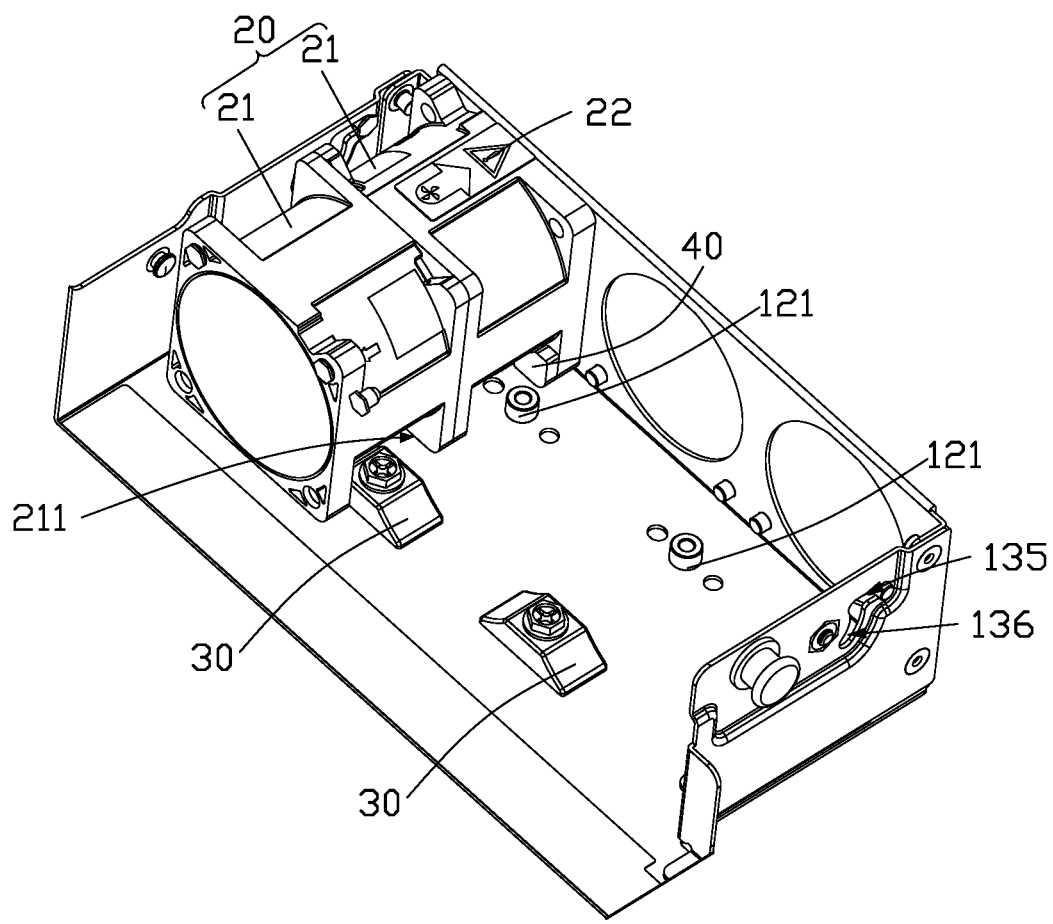
FIG. 6 is an isometric view of the mounting structure when the block is mounted on a second nut according to an embodiment of the present disclosure.

As shown in FIG. 5, the chassis 10 includes a plurality of fixing components 12 located on the bottom plate 131. One fixing component 12 is located between each two adjacent installing positions 11. Each fixing component 12 includes a first nut 121 and a second nut 122. The first nut 121 and the second nut 122 are arranged along the direction Y. In each fixing component 12, one block 30 is mounted on the first nut 121 or on the second nut 122, as shown in FIG. 3 and FIG. 6. As shown in FIG. 5, the chassis 10 has two fixing components 12 because there are three installing positions 11.

Figure 7:
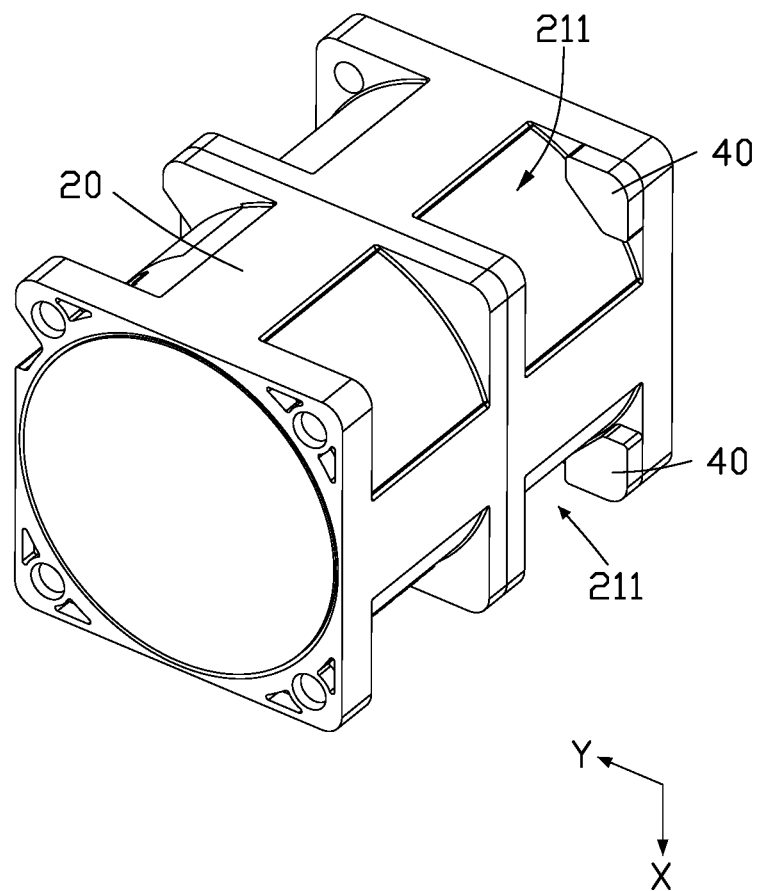
FIG. 7 is an isometric view of a fan module and accessory according to an embodiment of the present disclosure.

As shown in FIG. 7, two accessories 40 are mounted on both side of the fan module 20 along the direction X.

The direction of spin of the blades of the fan 21 is effectively not reversible, thus the fan 21 can blow air in only one direction. A first status of the fan module 20 is defined when the fan module 20 blows air into the bracket 210, and a second status of the fan module 20 is defined when the fan module 20 blows air out of the bracket 210.

Figure 11:
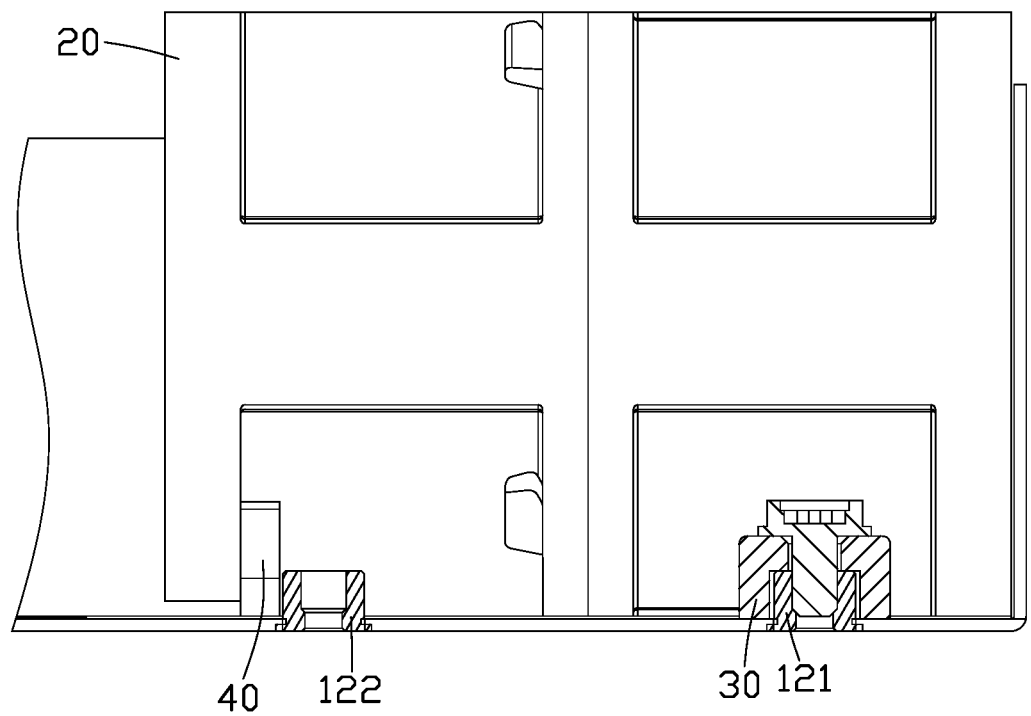
FIG. 11 is a side view of the fan module installed in a correct direction according to an embodiment of the present disclosure.
Figure 12:
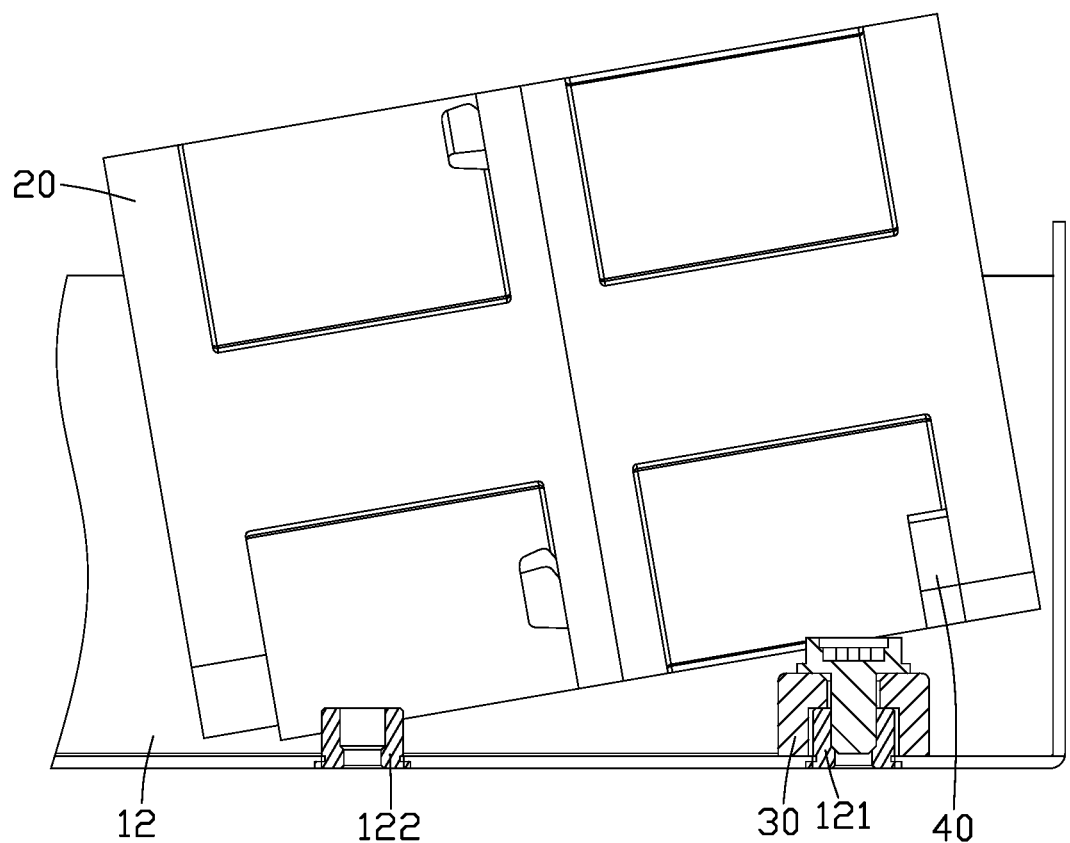
FIG. 12 is a side view of the fan module when incorrectly presented for installation according to an embodiment of the present disclosure.

For example, the first status may be the correct direction of fan module 20, and the second status would be the incorrect direction of fan module 20. The block 30 is fixed on the first nut 121, as shown in FIG. 3 and FIG. 11, the fan module 20 can only be placed in the installing position 11 in the first status, because in the first status the block 30 is distant from the accessories 40. The fan module 20 cannot be placed in the second status, because the block 30 interferes with the accessories 40 to stop the fan module 20 being installed in the second status, as shown in FIG. 12, effectively fool-proofing the installation of the fan 21.

In another example, the second status may be the correct direction of fan module 20, and then the first status is the incorrect direction of fan module 20. The block 30 is fixed on the second nut 122, as shown in FIG. 6, and thus the fan module 20 can only be placed in the installing position 11 in the second status, because in the second status the block 30 is distant from the accessories 40. In this example, the fan module 20 cannot be placed in the first status, because the block 30 interferes with the accessories 40 to stop installation of the fan module 20 in the first status, giving the same fool-proofing.

As shown in FIG. 7, in some embodiments, each fan 21 includes a shell, the shell defines two gaps 211 on both side along the direction X on the bottom. The gap 211 is configured for containing the block 30, as shown in FIG. 3 and FIG. 5.

In some embodiments, as shown in FIG. 3 and FIG. 5, a chamfer is defined at the topmost part of each side of the block 30 along the direction X.

In some embodiments, as shown in FIG. 7, the accessory 40 is mounted on the shell and located in the gap 211.

Each fan module 20 has an inlet and an outlet. In some embodiments, as shown in FIG. 3 and FIG. 6, each fan module 20 includes a sticker 22 with an arrow pointing to the outlet, and the accessory 40 is mounted beside the outlet.

In some embodiments, as shown in FIG. 3 and FIG. 5, the chassis 10 further includes a base 13 and a handle 14. The base 13 includes a first wall 132, a second wall 133, and a third wall 134. The first wall 132, the second wall 133, and the third wall 134 are connected in sequence and are connected to the bottom plate 131. The bottom plate 131 is used to support the fan module 20. The second wall 133 has a plurality of vents 133a, the vents 133a are arranged along the direction X. Each vent 133a corresponds to an installing position 11 to open the outlet or the inlet. The handle 14 is connected between the first wall 132 and the third wall 134. The handle 14 is rotatable along the direction X relative to the base 13. Each fan module 20 is mounted between the handle 14 and the second wall 133. The handle 14 is used for latching or unlatching the fan module 20.

Figure 8:
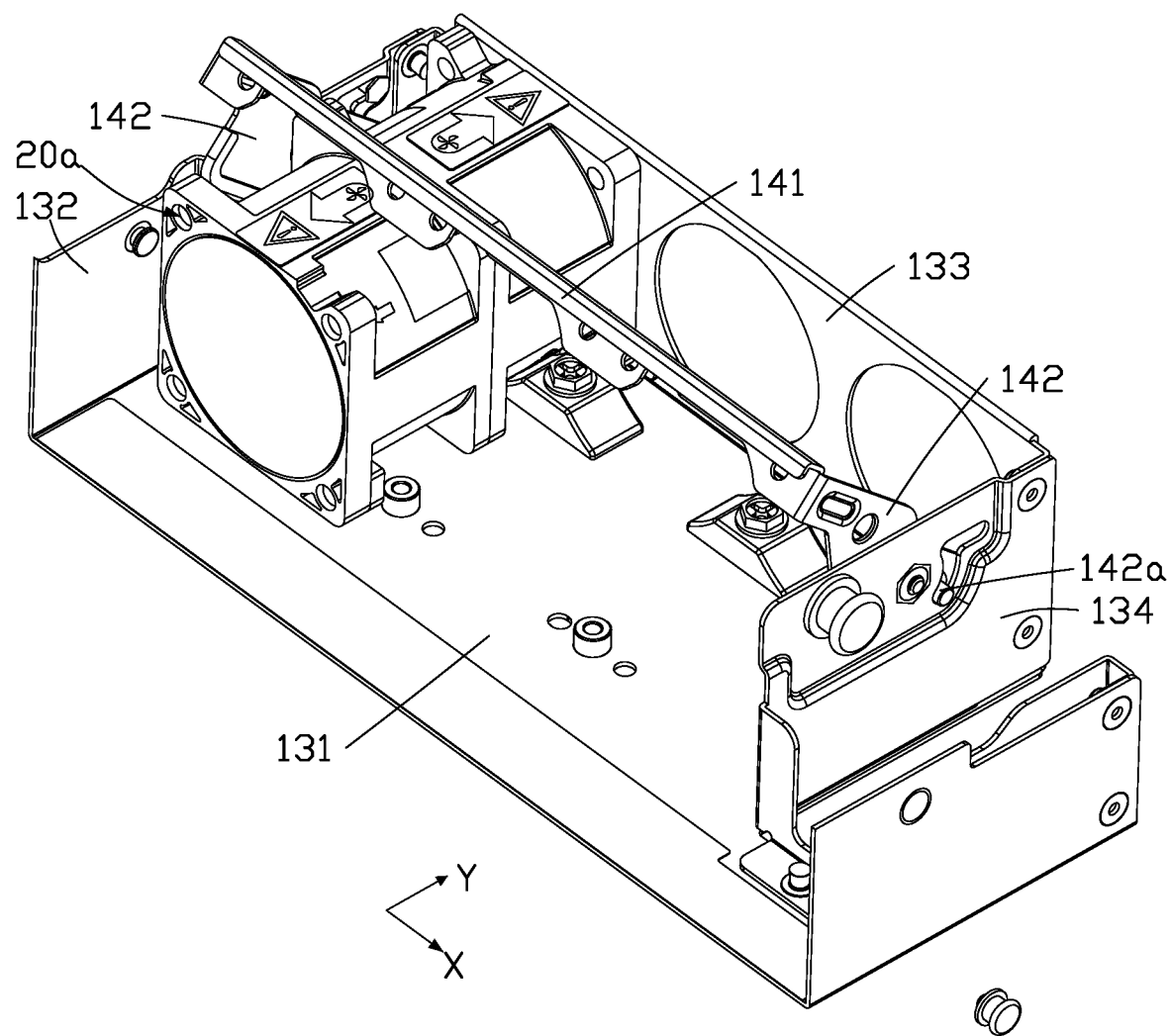
FIG. 8 is an isometric view of the mounting structure when the mounting structure is opened up for replacing a fan module.
Figure 9:
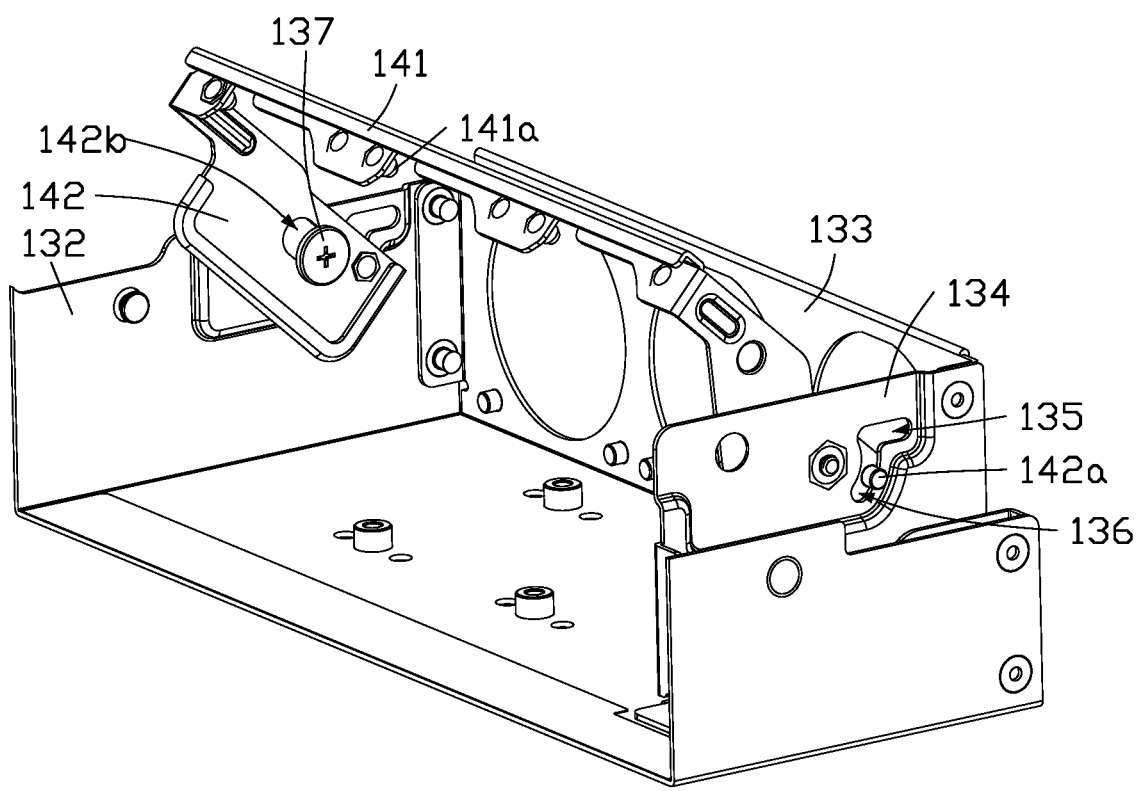
FIG. 9 is an isometric view of the chassis when the chassis is opened for replacing a fan module.
Figure 10:
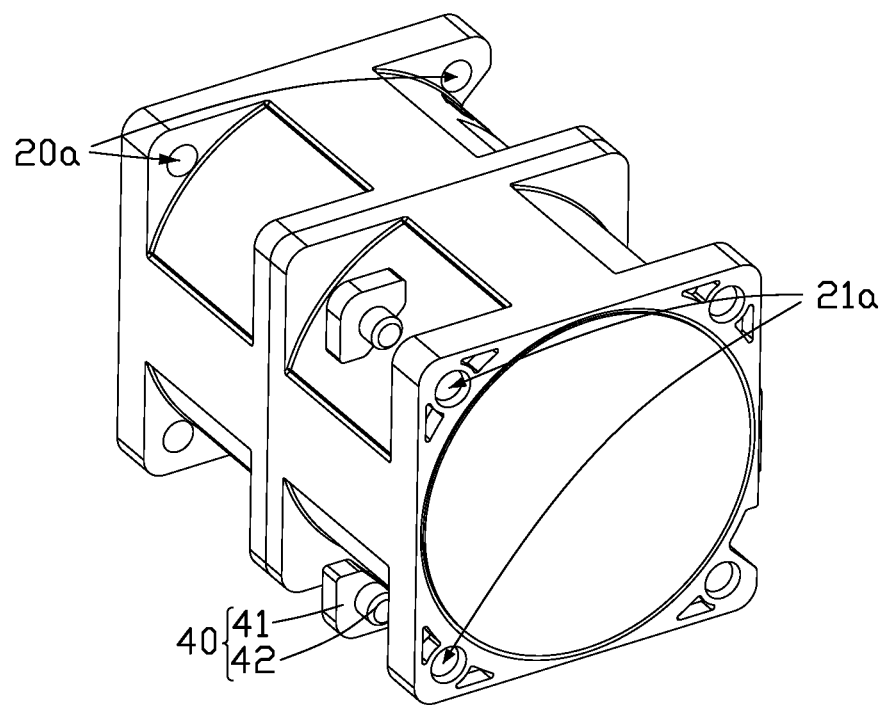
FIG. 10 is an exposed view of the fan module and an accessory according to an embodiment of the present disclosure.

As shown in FIG. 8 and FIG. 9, the handle 14 includes a positioning piece 141 and two extending pieces 142, the positioning piece 141 extends along the direction X. The two extending pieces 142 are located on each end of the positioning piece 141. The two extending pieces 142 are connected to the first wall 132 and the third wall 134, respectively. The positioning piece 141 includes a plurality of first pins 141a, as shown in FIG. 4. The first pins 141a are arranged along the direction X. The fan module 20 has two holes 20a on both sides along the direction Y, as shown in FIG. 8. The first pin 141a is inserted into the hole 20a to fix the fan module 20 in place.

As shown in FIG. 8, each extending piece 142 includes a second pin 142a. The first wall 132 and the third wall 134 both define a horizontal groove 135 and an arc-shaped groove 136, as shown in FIG. 5. The horizontal groove 135 and the arc-shaped groove 136 are connected. The second pin 142a is inserted into the horizontal groove 135 and the arc-shaped groove 136. Each extending piece 142 defines a slot 142b. The first wall 132 and the third wall 134 both comprise a third pin 137, and the third pin 137 is inserted into the slot 142b.

When the handle 14 is depressed, the second pin 142a moves along the arc-shaped groove 136 into the horizontal groove 135, meanwhile, the third pin 137 moves along the slot 142b, until the first pin 141a is pushed into the hole 20a, thereby the fan module 20 is latched with the positioning piece 141.

When the handle 14 is pulled and lifted out, the first pin 141a is pulled out of the hole 20a, the third pin 137 moves along the slot 142b, until the second pin 142a moves from the horizontal groove 135 to the end of the arc-shaped groove 136, the fan module 20 is thereby unlatched from the positioning piece 141 and removable from the mounting structure 100.

The handle 14 has a fourth pin 143, as shown in FIG. 3 and FIG. 4, the fourth pin 143 is used to fix the handle 14 to the base 13 after the handle 14 latches the fan module 20.

In some embodiments, each accessory 40 includes a main body 41 and a cylinder 42 connected to the main body 41. The shell of the fan 21 has a hole 21a in the gap 211. The cylinder 42 is inserted into the hole 21a to mount the main body 41 to the shell.

A server (not shown in figures) of an embodiment includes a plurality of electronic devices 200.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A mounting structure configured for preventing incorrect mounting and installation of cooling fan comprising:
    a chassis comprising a bottom plate;
    a block mounted on the bottom plate;
    a fan module comprising at least one fan; and
    at least one accessory mounted on the fan module;
    wherein when the fan module is positioned in a correct direction on the bottom plate, air flows through the fan module in a first direction, the block is distant away from the accessory; and
    wherein when the fan module is positioned in an incorrect direction on the bottom plate, air flows through the fan module in a second direction reverse to the first direction, the block interferes with the accessory.

2. The mounting structure of claim 1, wherein:
    the chassis defines a plurality of installing positions along a direction X, a fan module is placed in each of the plurality of installing positions, the fans are connected along a direction Y, the direction Y is substantially perpendicular to the direction X, the chassis comprises a plurality of fixing components, and one of the fixing components is located between each adjacent two ones of the plurality of installing positions, each of the plurality of fixing components comprises a first nut and a second nut, the first nut and the second nut are arranged along the direction Y, the block is mounted on the first nut or the second nut, two of the accessories are mounted on both sides of the fan module along the direction X.

3. The mounting structure of claim 2, wherein:
each fan comprises a shell, the shell defines two gaps on both sides along the direction X on the bottom, the gap is configured for containing the block, the accessory is mounted on the shell and located in the gap;
wherein when the fan module is positioned in a correct direction, the block is contained in the gap; and
wherein when the fan module is positioned in an incorrect direction, the block interferes with the accessory in the gap.

4. The mounting structure of claim 3, wherein:
the accessory is further configured to be mounted beside an outlet of the fan module.

5. The mounting structure of claim 4, wherein:
the chassis comprises a base and a handle, the base comprises a first wall, a second wall, and a third wall, the first wall, the second wall, and the third wall are connected in sequence, and each of the first wall, the second wall, and the third wall, is connected to the bottom plate, the second wall defines a plurality of vents arranged along the direction X, each of the plurality of vents corresponds to an installing position to open the outlet or an inlet of the fan module, the handle is connected between the first wall and the third wall, the handle is rotatable along the direction X relative to the base, the handle and the second wall are arranged to accommodate the fan module therein between.

6. The mounting structure configured for installing fan of claim 5, wherein:
the handle comprises a positioning piece and two extending pieces, the positioning piece extends along the direction X, the two extending pieces are located on each end of the positioning piece, the two extending pieces are connected to the first wall and the third wall, respectively, the positioning piece comprises a plurality of first pins arranged along the direction X, the first pin is insertable into holes to fix the fan module in the direction Y.

7. The mounting structure of claim 6, wherein:
each of the two extending pieces comprises a second pin, each of the first wall and the third wall defines a horizontal groove and an arc-shaped groove, the horizontal groove and the arc-shaped groove are connected, the second pin is insertable and movable into the horizontal groove and the arc-shaped groove, each of the two extending pieces further defines a slot, each of the first wall and the third wall comprises a third pin, the third pin is insertable and movable into the slot;
wherein when the handle is depressed, the second pin moves along the arc-shaped groove into the horizontal groove, the third pin moves along the slot, until the first pin is pushed into the hole so that the positioning piece becomes latched with the fan module; and
wherein when the handle is pulled and lifted out, the first pin is pulled out of the hole, the third pin moves along the slot, until the second pin moves from the horizontal groove into an end of the arc-shaped groove so that the positioning piece unlatches the fan module.

8. The mounting structure of claim 1, wherein:
each fan module comprises a sticker with an arrow to point the outlet.

9. The mounting structure of claim 3, wherein:
each of the at least one accessory comprises a main body and a cylinder connected to the main body, the shell defines a hole in the gap, the cylinder is insertable into a hole in a shell of the fan module to mount the main body to the shell.

10. The mounting structure of claim 2, wherein:
a chamfer is defined at a topmost part of each side of the block along the direction X.

11. An electronic device comprising:
a bracket comprising a bottom wall and two side walls located on the bottom wall; and
a mounting structure configured for installing a fan to the bracket; wherein
the mounting structure comprises:
a chassis comprising a bottom plate connecting to the bottom wall;
a block mounted on the bottom plate;
a fan module comprising at least one fan; and
at least one accessory mounted on the fan module;
wherein when the fan module is positioned in a correct direction on the bottom plate, air flows through the fan module in a first direction, the block is distant away from the accessory; and
wherein when the fan module is positioned in an incorrect direction on the bottom plate, air flows through the fan module in a second direction reverse to the first direction, the block interferes with the accessory.

12. The electronic device of claim 11, wherein:
the chassis defines a plurality of installing positions along a direction X, a fan module is placed in each of the plurality of installing positions, the fans are connected along a direction Y, the direction Y is substantially perpendicular to the direction X, the chassis comprises a plurality of fixing components, and one of the fixing components is located between each adjacent two ones of the plurality of installing positions, each of the plurality of fixing components comprises a first nut and a second nut, the first nut and the second nut are arranged along the direction Y, the block is mounted on the first nut or the second nut, two of the accessories are mounted on both sides of the fan module along the direction X.

13. The electronic device of claim 12, wherein:
each fan comprises a shell, the shell defines two gaps on both sides along the direction X on the bottom, the gap is configured for containing the block, the accessory is mounted on the shell and located in the gap;
wherein when the fan module is positioned in a correct direction, the block is contained in the gap; and
wherein when the fan module is positioned in an incorrect direction, the block interferes with the accessory in the gap.

14. The electronic device of claim 13, wherein:
the accessory is further configured to be mounted beside an outlet of the fan module.

15. The electronic device of claim 14, wherein:
the chassis comprises a base and a handle, the base comprises a first wall, a second wall, and a third wall, the first wall, the second wall, and the third wall are connected in sequence, and each of the first wall, the second wall, and the third wall, is connected to the bottom plate, the second wall defines a plurality of vents arranged along the direction X, each of the plurality of vents corresponds to an installing position to open the outlet or an inlet of the fan module, the handle is connected between the first wall and the third wall, the handle is rotatable along the direction X relative to the base, the handle and the second wall are arranged to accommodate the fan module therein between.

16. The electronic device of claim 15, wherein:
the handle comprises a positioning piece and two extending pieces, the positioning piece extends along the direction X, the two extending pieces are located on each end of the positioning piece, the two extending pieces are connected to the first wall and the third wall, respectively, the positioning piece comprises a plurality of first pins arranged along the direction X, the first pin is insertable into holes to fix the fan module in the direction Y.

17. The electronic device of claim 16, wherein:
each of the two extending pieces comprises a second pin, each of the first wall and the third wall defines a horizontal groove and an arc-shaped groove, the horizontal groove and the arc-shaped groove are connected, the second pin is insertable and movable into the horizontal groove and the arc-shaped groove, each of the two extending pieces further defines a slot, each of the first wall and the third wall comprises a third pin, the third pin is insertable and movable into the slot;
wherein when the handle is depressed, the second pin moves along the arc-shaped groove into the horizontal groove, the third pin moves along the slot, until the first pin is pushed into the hole so that the positioning piece becomes latched with the fan module; and
wherein when the handle is pulled and lifted out, the first pin is pulled out of the hole, the third pin moves along the slot, until the second pin moves from the horizontal groove into an end of the arc-shaped groove so that the positioning piece unlatches the fan module.

18. The electronic device of claim 11, wherein:
each fan module comprises a sticker with an arrow to point the outlet.

19. The electronic device of claim 13, wherein:
each of the at least one accessory comprises a main body and a cylinder connected to the main body, the shell defines a hole in the gap, the cylinder is insertable into a hole in a shell of the fan module to mount the main body to the shell.

20. A server comprising:
a plurality of electronic device; wherein
each of the plurality of electronic devices comprises:
a bracket comprising a bottom wall and two side walls located on the bottom wall; and
a mounting structure configured for installing a fan to the bracket; wherein
the mounting structure comprises:
a chassis comprising a bottom plate connecting to the bottom wall;
a block mounted on the bottom plate; and
an accessory configured for being mounted on a fan module;
wherein when the fan module is installed in a correct direction on the bottom plate, air flows through the fan module in a first direction, the block is distant away from the accessory;
wherein when the fan module is installed in an incorrect direction on the bottom plate, air flows through the fan module in a second direction reverse to the first direction, the block interferes with the accessory to stop the fan module being installed.

* * * * *